(12) United States Patent
Du et al.

(10) Patent No.: US 8,487,682 B2
(45) Date of Patent: Jul. 16, 2013

(54) MULTI-PHASE CLOCK GENERATOR

(75) Inventors: Zhenchang Du, Hangzhou (CN);
Haiming Tang, Cupertino, CA (US);
Wei Wang, San Jose, CA (US)

(73) Assignee: Initio Corporation, San Jose, CA (US)

( * ) Notice: Subject to any disclaimer, the term of this patent is extended or adjusted under 35 U.S.C. 154(b) by 61 days.

(21) Appl. No.: 13/207,768

(22) Filed: Aug. 11, 2011

(65) Prior Publication Data

US 2013/0038370 A1 Feb. 14, 2013

(51) Int. Cl.
*H03H 11/16* (2006.01)
*H03K 5/13* (2006.01)

(52) U.S. Cl.
USPC ........... 327/231; 327/233; 327/237; 327/291; 327/298; 327/299

(58) Field of Classification Search
USPC ......................................... 327/231, 238, 298
See application file for complete search history.

(56) References Cited

U.S. PATENT DOCUMENTS

2005/0285652 A1* 12/2005 Panikkar et al. .............. 327/231

\* cited by examiner

*Primary Examiner* — John Poos
(74) *Attorney, Agent, or Firm* — Duane Morris LLP (57) ABSTRACT

A clock generator includes a first latch configured to output a first intermediate clock phase signal based on a first clock signal and a second intermediate clock phase signal. A first phase interpolation circuit has a first input coupled to a first input of the first latch and a second input coupled to a first output of the first latch. The first phase interpolation circuit is configured to output a first clock phase signal based on the first and second intermediate clock phase signals.

21 Claims, 7 Drawing Sheets

MULTI-PHASE CLOCK GENERATOR

FIELD OF DISCLOSURE

The disclosed system and method relate to integrated circuits. More specifically, the disclosed system and method relate to multi-phase clock generators for integrated circuits.

BACKGROUND

Multi-phase clock generators are widely used in data communication systems to provide timing signals for the data communication system. Some data communication systems use multi-phase clock dividers as a multi-phase generators. However, these conventional multi-phase clock dividers can suffer from duty cycle distortion, which results in undesirable phase offsets that may lead to timing issues in the system.

SUMMARY

In some embodiments, a clock generator includes a first latch configured to output a first intermediate clock phase signal based on a first clock signal and a second intermediate clock phase signal. A first phase interpolation circuit has a first input coupled to a first input of the first latch and a second input coupled to a first output of the first latch. The first phase interpolation circuit is configured to output a first clock phase signal based on the first and second intermediate clock phase signals.

In some embodiments, a method includes receiving a first clock signal and a first intermediate clock phase signal at a first latch, generating a second intermediate clock phase signal based on the first clock signal and the first intermediate clock phase signal, and interpolating the first and second intermediate clock phase signals to provide a first clock phase signal.

In some embodiments, a multi-phase clock generator includes a first latch configured to output a first intermediate clock phase signal based on a first clock signal and a second intermediate clock phase signal and output a third intermediate clock phase signal based on the first clock signal and a fourth intermediate clock phase signal. A first phase interpolation circuit has a first input coupled to a first input of the first latch and a second input coupled to a first output of the first latch. The first phase interpolation circuit is configured to output a first clock signal based on the first and second intermediate clock phase signals. A second phase interpolation circuit has a first input coupled to a second input of the first latch and a second input coupled to a second output of the first latch. The second phase interpolation circuit is configured to output a second clock phase signal based on the third and fourth intermediate clock phase signals.

DETAILED DESCRIPTION

Figure 1:
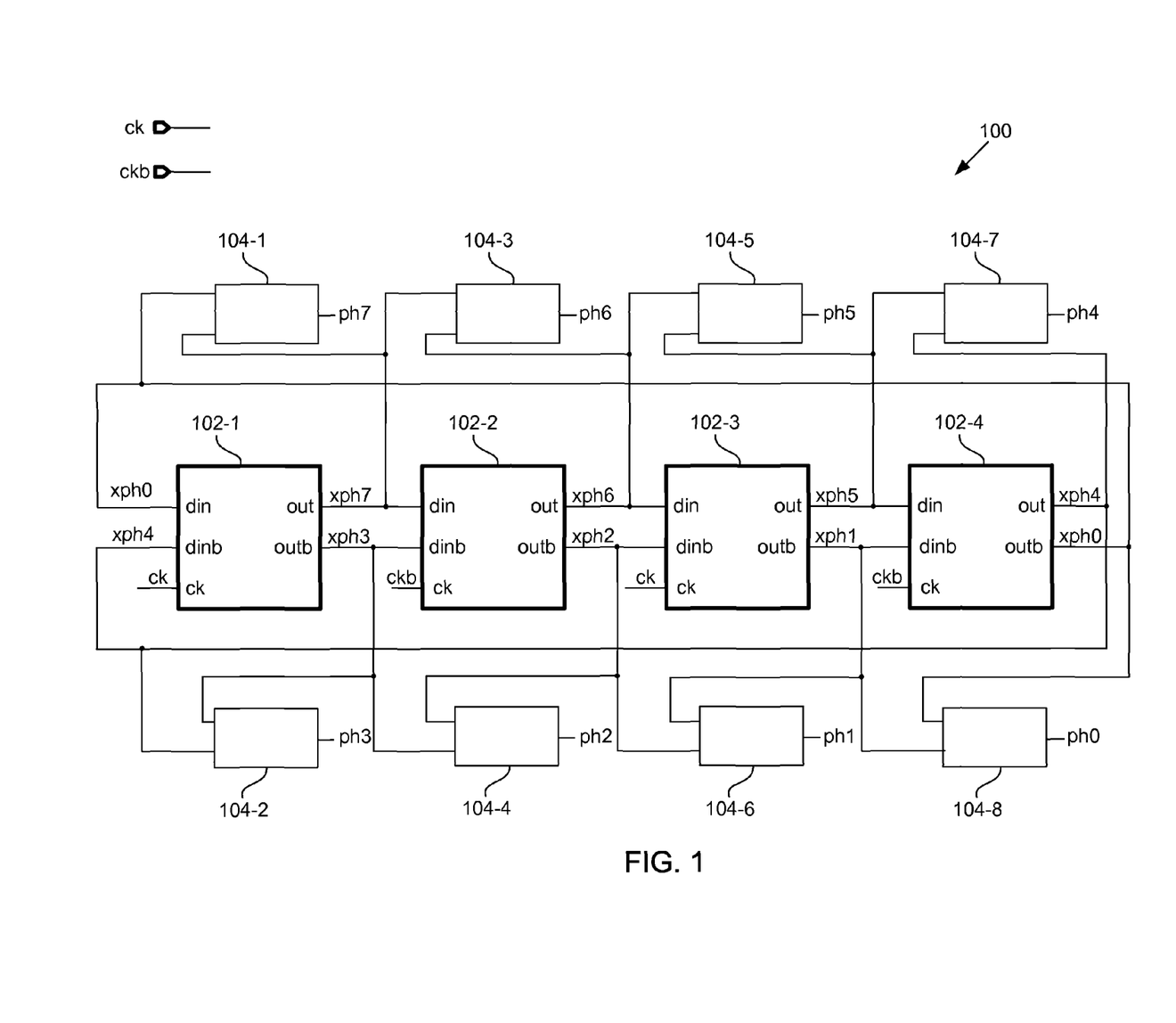
FIG. 1 is a block diagram of one example of an improved multi-phase clock generator.

The improved multi-phase clock generator disclosed herein advantageously reduces skew based on duty cycle distortion. FIG. 1 illustrates one example of an improved multi-phase clock generator 100 that includes a plurality of latches 102 arranged in series with each other. Although four latches 102 are illustrated, one skilled in the art will understand that any number of latches may be implemented. Each of the one or more latches 102 is coupled to one or more phase interpolation circuits 104. Latches 102 are configured to output at least one intermediate clock phase signal in response to receiving an input clock signal, e.g., at least one of ck and ckb. Phase interpolation circuits 104 output clock phase signals based on a pair of intermediate clock phase signals.

As shown in FIG. 1, latch 102-1 receives clock signal ck and intermediate clock phase signals, xph0 and xph4, at its inputs. Intermediate clock phase signals xph0 and xph4 are output from the last latch 102-4 in the series of latches of multi-phase clock generator 100. Latch 102-2 receives clock signal ckb, which is the inverse of clock signal ck, and intermediate clock phase signals xph7 and xph3, which are output from latch 102-1. Latch 102-2 outputs intermediate clock phase signals xph6 and xph2 to latch 102-3, which also receives clock signal ck. Latch 102-3 outputs intermediate clock phase signals xph5 and xph1 to latch 102-4 in response to receiving clock signal ckb and intermediate clock phase signals xph6 and xph2. Latch 102-4 outputs intermediate clock phase signals xph4 and xph0 in response to receiving intermediate clock phase signals xph5 and xph1 from latch 102-3 and receiving clock signal ckb.

Phase interpolation circuits 104 each receive a pair of intermediate clock phase signals and in response output a clock phase signal that is an interpolation of the pair of intermediate clock phase signals. For example, phase interpolation circuit 104-1 receives intermediate clock phase signals xph0 from latch 102-4 and xph7 from latch 102-1 and outputs clock phase signal ph7. Phase interpolation circuit 104-2 receives intermediate clock phase signal xph4 from latch 102-4 and intermediate clock phase signal xph3 from latch 102-1 and in response outputs clock phase signal ph3.

Clock phase signal ph6 is output from phase interpolation circuit 104-3 in response to receiving intermediate clock phase signal xph7 from latch 102-1 and intermediate clock phase signal xph6 from latch 102-2. Clock phase signal ph2 is output from phase interpolation circuit 104-4 in response to receiving intermediate clock phase signal xph3 from latch 102-1 and intermediate clock phase signal xph2 from latch 102-2.

Phase interpolation circuit 104-5 outputs clock phase signal ph5 in response to receiving intermediate clock phase signal xph6 from latch 102-2 and intermediate clock phase signal pxh5 from latch 102-3. Phase interpolation circuit 104-6 outputs clock phase signal xph1 based on an interpolation of intermediate clock phase signal xph2 received from latch 102-2 and intermediate clock phase signal xph1 received from latch 102-3.

Clock phase signal ph4 is output from phase interpolation circuit 104-7 based on an interpolation of intermediate clock phase signal xph5, which is received from latch 102-3, and intermediate clock phase signal xph4, which is received from latch 102-4. Phase interpolation circuit 104-8 outputs clock phase signal ph0 in response to receiving intermediate clock phase signal xph1 from latch 102-3 and intermediate clock phase signal xph0 from latch 102-4.

Figure 2A:
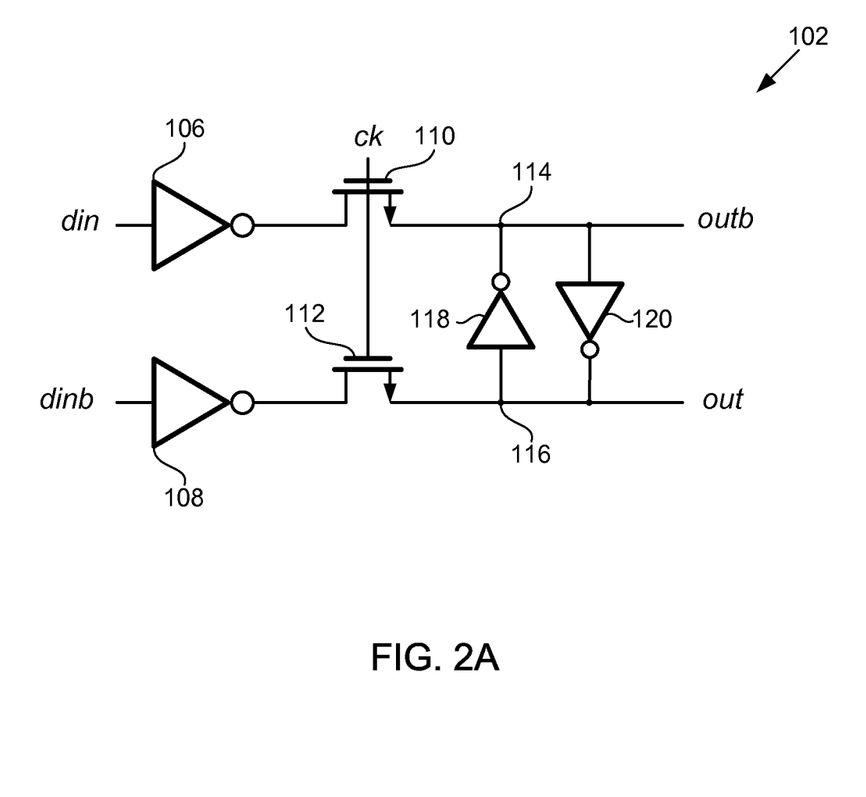
FIG. 2A illustrates one example of a latch in accordance with the multi-phase clock generator illustrated in FIG. 1.

FIG. 2A illustrates one example of a latch 102 in accordance with the multi-phase clock generator 100 illustrated in FIG. 1. As shown in FIG. 2A, latch 102 includes a first inverter 106 having an input, din, and a second inverter 108 having an input, dinb. The outputs of inverters 106 and 108 are respectively coupled to the drain of NMOS transistors 110 and 112. The gates of transistors 110 and 112 are configured to receive one of the clock signals, e.g., ck or ckb, which controls the turning on and off of transistors 110 and 112. The source of transistor 110 is coupled to node 114, which serves as an output, outb, of latch 102. The source of transistor 112 is coupled to node 116, which also serves as an output, out, of latch 102. A pair of cross-coupled inverters 118 and 120 may be coupled between nodes 114 and 116 to assist in reducing the skew of the output signals.

Figure 2B:
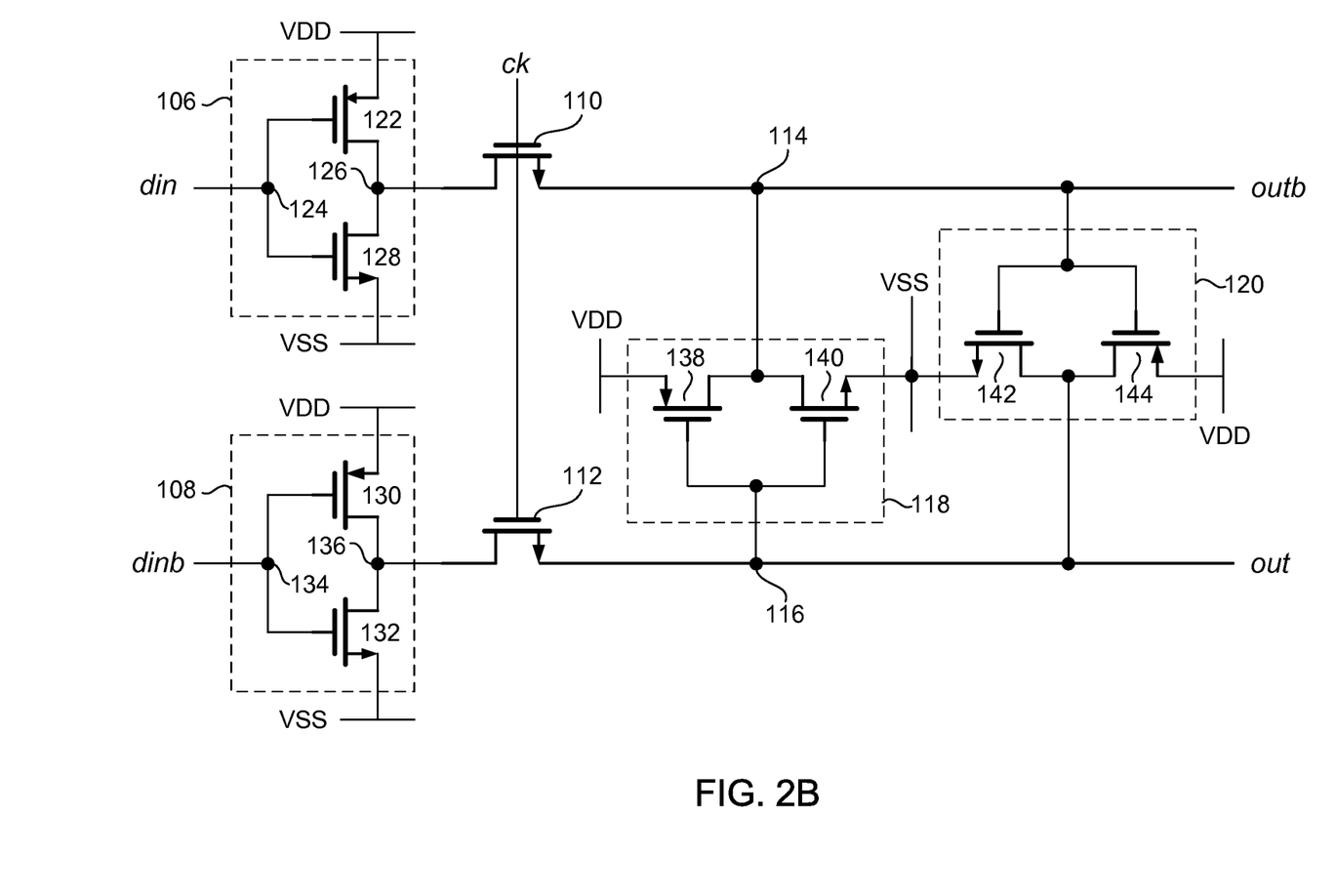
FIG. 2B illustrates one example of the latch illustrated in FIG. 2A formed using complementary metal oxide semiconductor technology.

Latches 102 may be formed using complementary metal oxide semiconductor ("CMOS") technology as illustrated in FIG. 2B. As shown in FIG. 2B, inverter 106 includes a PMOS transistor 122 having a gate coupled to input node 124, a source coupled to voltage supply rail VDD, and a drain coupled to output node 126. NMOS transistor 128 has its source coupled to a low voltage supply rail, which may be set at VSS, its gate coupled to input node 124, and its drain coupled to output node 126, which is coupled to the drain of transistor 110.

Inverter 108 also includes a PMOS transistor 130 and an NMOS transistor 132. Transistor 130 has its gate coupled to input node 134, its source coupled to a high voltage supply rail, which may be set at VDD, and its drain coupled to output node 136. Transistor 132 has its gate coupled to input node 134, its source coupled to a low voltage supply rail, and its drain coupled to output node 136, which is coupled to the drain of transistor 112.

Inverter 118 includes an PMOS transistor 138 having its gate coupled to input node 116, its source coupled to a high voltage supply rail, and its drain coupled to output node 114. NMOS transistor 140 has its gate coupled to node 116, its source coupled to a low voltage power supply rail, and its drain coupled to node 114. Inverter 120 also includes an NMOS transistor 142 and a PMOS transistor 144. NMOS transistor 142 has its source coupled to a low voltage power supply rail, its gate coupled to node 114, and its drain coupled to node 116. PMOS transistor has its source coupled to a high voltage power supply line, its drain coupled to node 116, and its gate coupled to node 114.

Figure 3A:
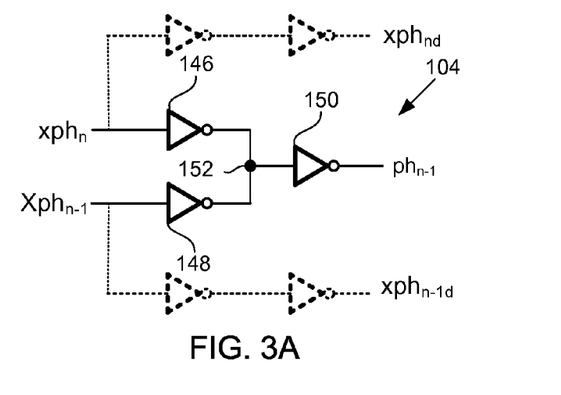
FIG. 3A illustrates one example of a phase interpolation circuit in accordance with the multi-phase clock generator illustrated in FIG. 1.

One example of a phase interpolation circuit 104 is illustrated in FIG. 3A. As shown in FIG. 3A, phase interpolation circuit 104 includes a pair of input inverters 146 and 148 each having an output coupled to an input of output inverter 150. Each input inverter 146, 148 receives a respective intermediate clock phase signal at its input. For example, inverter 146 receives intermediate clock phase signal, $xph_n$, at its input and inverter 148 receives a next consecutive intermediate clock phase signal, $xph_{n-1}$, at its input. The intermediate clock phase signals received at the inputs of input inverters 146 and 148 are received from latches 102 as shown in FIG. 1.

Figure 4A:
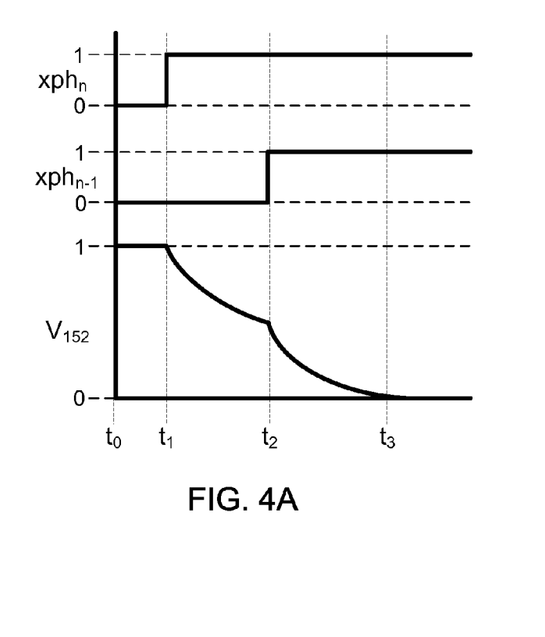
FIG. 4A is a timing diagram illustrating the voltage transitions at different nodes of the phase interpolation circuit illustrated in FIG. 3A.

Each input inverter 146, 148 has its output coupled to node 152, which is coupled to the input of output inverter 150. Output inverter 150 outputs a clock phase signal that is an interpolation of the two intermediate clock phase signals, $xph_n$ and $xph_{n-1}$, received at the inputs of input inverters 146 and 148. For example, FIG. 4A illustrates voltage levels of intermediate clock phase signals, $xph_n$ and $xph_{n-1}$, received at the input of input inverters 146 and 148 and the corresponding voltage at node 152, $V_{152}$. As shown in FIG. 4A, intermediate phase signals $xph_n$ and $xph_{n-1}$ are at logic zeroes at time $t_0$, which results in the voltage at node 152, $V_{152}$, being a logic one.

At time $t_1$, intermediate clock phase signal $xph_n$ transitions from a logic zero to a logic one while intermediate clock phase signal $xph_{n-1}$ is maintained at a logic zero. The transitioning of intermediate clock phase signal $xph_n$ from a logic zero to a logic one begins to pull down voltage $V_{152}$. At time $t_2$, intermediate clock phase signal $xph_n$ is maintained at a logic one and intermediate clock phase signal $xph_{n-1}$ transitions from a logic zero to a logic one, which results in the voltage $V_{152}$ to continue to be pulled towards a logic one. At time $t_3$, voltage $V_{152}$ reaches a logic zero potential while intermediate clock phase signals $xph_n$ and $xph_{n-1}$ are maintained at logic ones.

Figure 4B:
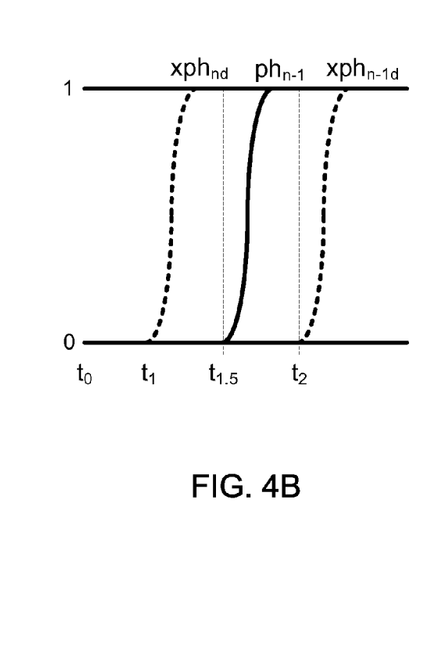
FIG. 4B is a timing diagram illustrating one example of an interpolation of two intermediate clock phase signals into a clock phase signal in accordance with the phase interpolation circuit illustrated in FIG. 3A.

FIG. 4B illustrates the relationship between delayed intermediate clock phase signals $xph_{nd}$ and $xph_{n-1d}$ and the resultant clock phase signal $ph_{n-1}$. As shown in FIG. 4B, clock phase signal $xph_{n-1}$ is an interpolation of intermediate clock phase signals $xph_n$ and $xph_{n-1}$ such that clock phase signal $ph_{n-1}$ transitions from a logic zero to a logic one at time $t_{1.5}$ that is approximately half way between the times when the delayed intermediate clock phase signals $xph_{nd}$ and $xph_{n-1d}$ transition from logic zeroes to logic ones. The dotted paths in FIG. 4B are shown for illustrative purposes of the interpolation and do not need to be implemented.

Figure 3B:
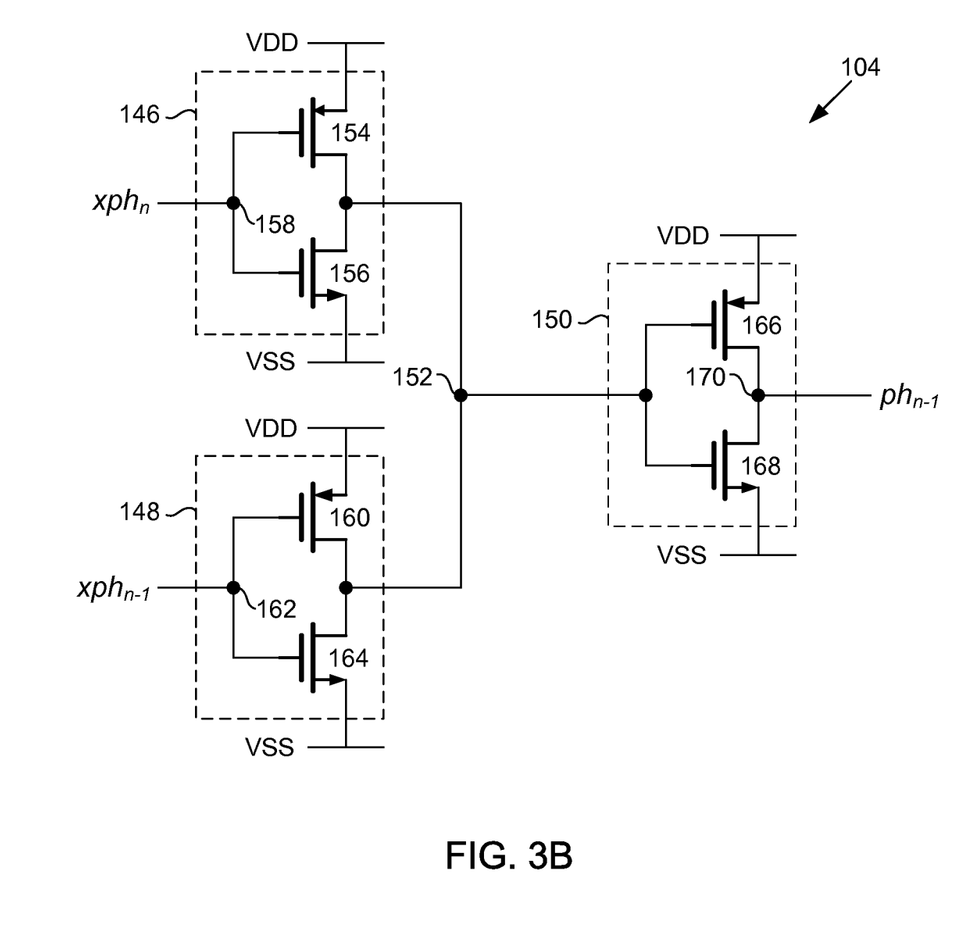
FIG. 3B illustrates one example of the phase interpolation circuit illustrated in FIG. 3A formed using complementary metal oxide semiconductor technology.

Phase interpolation circuits 104 may also be formed using CMOS technology as illustrated in FIG. 3B. As shown in FIG. 3B, inverter 146 includes a PMOS transistor 154 having a source coupled to a high voltage supply rail, a drain coupled to node 152, and a gate coupled to input node 158, which is configured to receive intermediate clock phase signal $xph_n$. Transistor 156 has its source coupled to a low voltage supply rail, a drain coupled to node 152 and its gate coupled to input node 158. Input node 158 of transistor 146 may be coupled to one of nodes 114 or 116 of latch 102 (FIGS. 2A and 2B) such that inverter 146 receives intermediate clock phase signal $xph_n$.

Inverter 148 includes a PMOS transistor 160 having its gate coupled to input node 162, its drain coupled to node 152, and its source coupled to a high voltage supply rail. NMOS transistor 164 has its gate coupled to input node 162, its source coupled to a low voltage supply rail, and its drain coupled to node 152. Input node 162 of inverter 148 may be coupled to one of nodes 114 or 116 of latch 102 (FIGS. 2A and 2B) such that inverter 148 receives intermediate clock phase signal $xph_{n-1}$.

Inverter 150 includes a PMOS transistor 166 and an NMOS transistor 168, which have their drains coupled together at output node 170. The source of transistor 166 is coupled to a high voltage supply rail, and the gate of transistor 166 is coupled to node 152. Transistor 168 has its source coupled to a low voltage supply rail and its gate coupled to node 152. Node 170 outputs clock phase signal $ph_{n-1}$.

Figure 5:
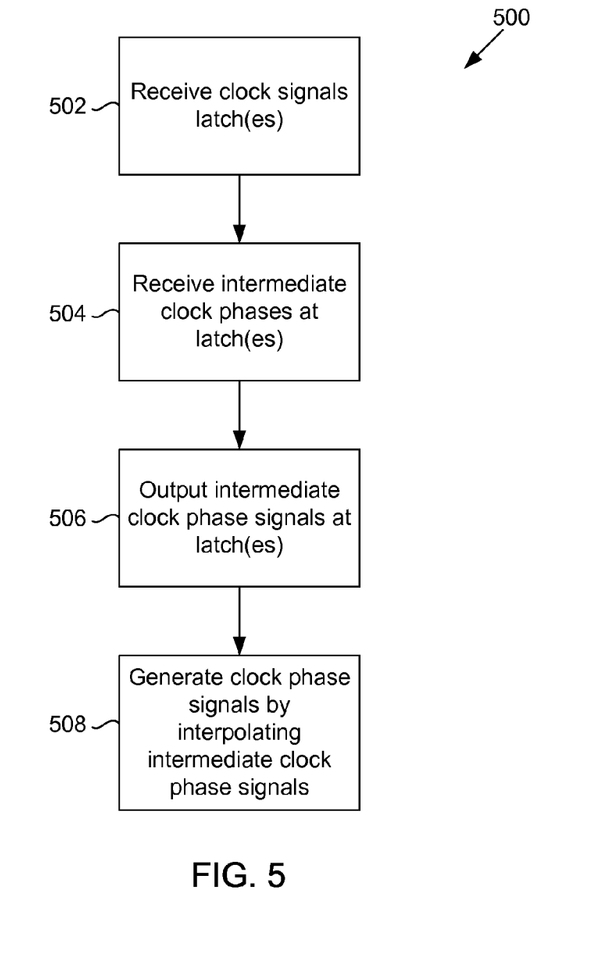
FIG. 5 is a flow diagram of one example of a method of generating multi-phase clock signals.

The operation of multi-phase clock generator 100 is described with reference to FIG. 5, which is a flow diagram of one example of a method 500 of generating multi-phase clock signals. At block 502, one or more clock signals are received at one or more latches 102. For example, latches 102-1 and 102-2 in FIG. 1 may receive clock signal ck, and latches 102-2 and 102-4 may received clock signal ckb. As shown in FIGS. 2A and 2B, clock signals ck and ckb may be received at the gates of transistors 110 and 112 of a latch 102.

At block 504, one or more intermediate clock signals are received at one or more latches 102. For example, latch 102-1, which may be the first latch of the multi-phase clock generator 100, may receive a pair of intermediate clock phase signals from the last latch of the multi-phase clock generator 100, e.g., latch 102-4. However, one skilled in the art will understand that multi-phase clock generator may include one or more latches 102. For example, latch 102-1 may be the only latch 102 such that the output of latch 102-1 may be fed back to the inputs of latch 102-1. Latch 102-2 may receive intermediate clock phase signals from latch 102-1, latch 102-3 may receive intermediate clock phase signals from latch 102-3, and latch 102-4 may received intermediate clock phase signals from latch 104-3.

At block 506, one or more intermediate clock phase signals are generated. As described above, the intermediate clock phase signals are generated by each of the latches 102 of the multi-phase clock generator 100 in response to the clock signal and the intermediate clock phase signals received at the inputs, i.e., the intermediate clock phase signals output in response to a previous clock pulse.

For example, one intermediate clock phase signal is received at node 124 of inverter 106 and another intermediate clock phase signal is received at node 134 of inverter 108. A clock signal, e.g., ck or ckb, is received at the gate of transistors 110 and 112. Transistors 110 and 112 are turned into current-conducting 'on' states when the clock signal, e.g., ck or ckb, is a logic one. With transistors 110 and 112 on, the respective outputs of inverters 106 and 108 are respectively coupled to output nodes 114 and 116 of latch 102 such that the signal output to node 114 is a delayed inversion of the signal received at the input of inverter 106 and signal output to node 116 is a delayed inversion of the signal received at the input of inverter 108.

If, for example, the voltage at node 124 of inverter 106 is a logic one, then transistor 122 is turned off and transistor 128 is turned on such that VSS is coupled to node 126. The voltage of VSS is coupled through transistor 110 to node 114 to provide a first intermediate clock phase signal that is a delayed inversion of the signal received at node 124. If the voltage at node 124 of inverter 106 is a logic zero, then transistor 122 is turned on and transistor 128 is turned off such that VDD is coupled to node 126. The voltage of VSS is coupled through transistor 110 to node 114 to provide a first intermediate clock phase signal that is a delayed inversion of the signal received at node 124. The operation of inverter 108, which provides a second intermediate clock phase signal, is similar to the operation of inverter 106 in response to receiving a signal at node 134.

Inverters 118 and 120 assist in developing the signal at nodes 114 and 116. For example, if a logic one develops at node 114, then transistor 142 of inverter 120 turns on and transistor 144 of inverter 120 turns off such that node 116 is coupled to the voltage of VSS. A logic zero developing at node 116 results in transistor 138 of inverter 118 turning on and transistor 140 of inverter 118 turning off such that node 114 is coupled to VDD.

At block 508, phase interpolation circuits 104 interpolate the intermediate clock phase signals to generate clock signals. As best seen in FIG. 3B, phase interpolation circuits receive a first intermediate clock phase signal at node 158, which is the input node of transistor 146, and a second intermediate clock phase signal at node 162, which is the input node of transistor 148. If the intermediate clock phase signal received at node 158 is a logic zero, then transistor 156 is in a non-current-conducting 'off' state and transistor 154 is turned on such that VDD is coupled to node 152 through transistor 154 to begin pulling up the voltage at node 152.

If the intermediate clock phase signal received at node 162 is a logic zero, then transistor 160 is turned on and transistor 164 is turned off such that VDD is coupled to node 152. When inverter 146 outputs a logic zero and inverter 148 outputs a logic one, which may happen for a period of time, the voltage at node 152 is between the voltage of VDD and VSS. When inverters 146 and 148 output the same voltage potential, the voltage at node 152 transitions to one of VDD or VSS.

The voltage at node 152 is received by inverter 150. If the voltage at node 152 is a logic one, then the transistor 168 is turned on and transistor 166 is turned off such that VSS is coupled to output node 170. In contrast, if the voltage at node 152 is a logic zero, then the transistor 166 is turned on and transistor 168 is turned off such that VDD is coupled to output node 170. In this manner, phase interpolation circuit 104 interpolates a pair of intermediate clock phase signals into a clock phase signal.

Figure 6:
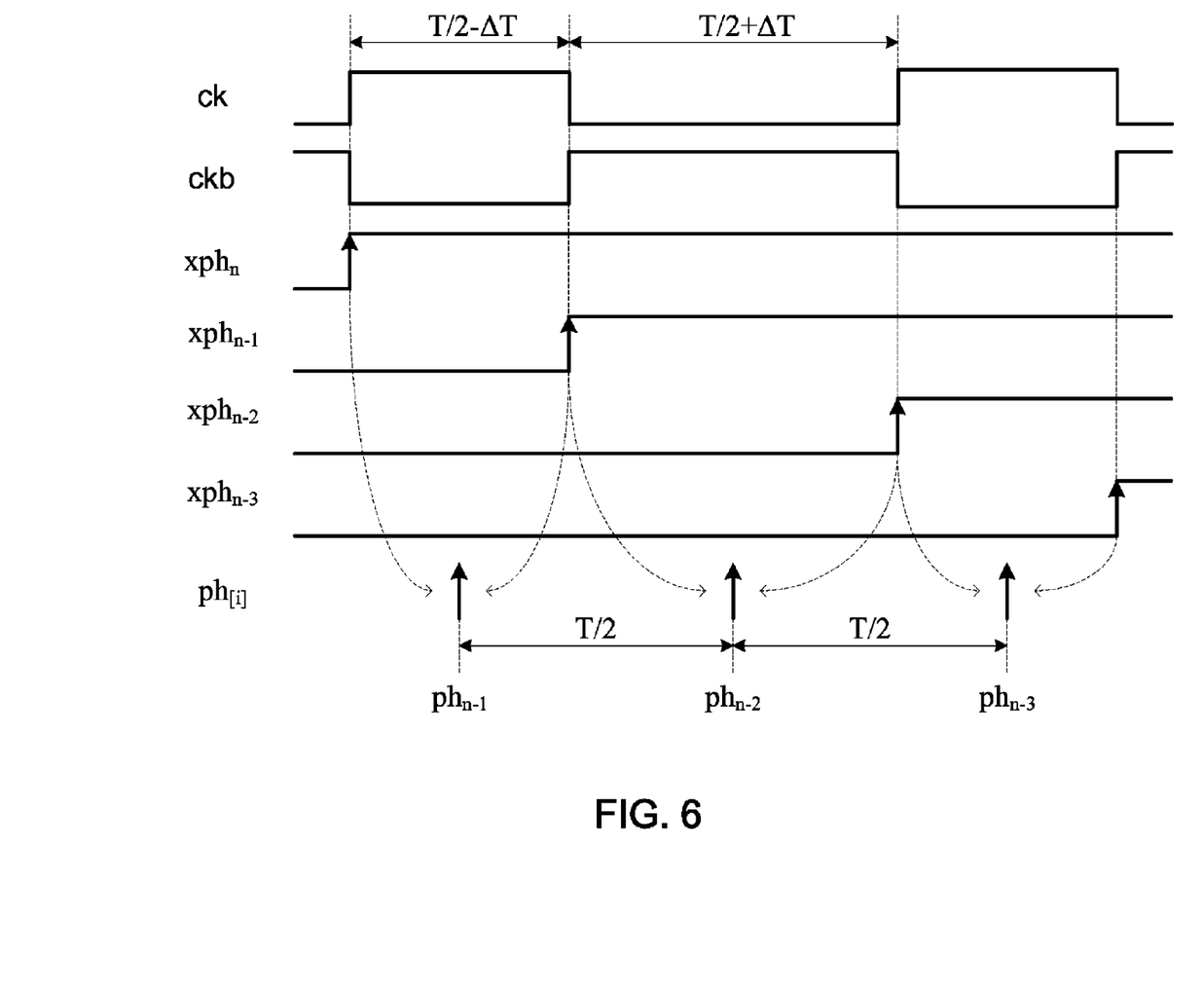
FIG. 6 is a timing diagram illustrating how the phase interpolation circuits reduce skew due to duty cycle distortion.

The multi-phase clock generator 100 that includes phase interpolation circuits 104 advantageously reduces any skew due to duty cycle distortion of input clock signals ck and ckb, i.e., any difference between the time a clock signal is high and the time the same clock signal is low. For example, FIG. 6 illustrates a pair of input clock signals ck and ckb each having duty cycle distortion. As shown in FIG. 6, clock signal ck is a logic one for a shorter period of time than it is a logic zero. Conversely, clock signal ckb is a logic one for a longer period of time than it is a logic one.

The adjacent intermediate clock phase signals of multi-phase clock generator 100 are triggered by the rising edges of clock signals ck and ckb such that any duty cycle distortion will deviate with a phase offset of ΔT, i.e., T/2−ΔT and T/2+ΔT. However, such duty-cycle distortion is substantially eliminated by the interpolating the adjacent phases by phase interpolation circuits 104 as the period of the resultant interpolation is equal to:

$$\frac{\left(\frac{T}{2} - \Delta T\right) + \left(\frac{T}{2} + \Delta T\right)}{2} = \frac{T}{2}$$

As shown in FIG. 6, the delay of the adjacent resultant interpolated signals, $ph_{n-1}$ and $ph_{n-2}$, is approximately equal to T/2. Accordingly, the improved multi-phase clock generator with novel interpolation circuits advantageously reduces and/or eliminates skew between different clock phase signals attributed to duty cycle distortion of the input clock cycles.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:
1. A clock generator, comprising:
 a first latch configured to output a first intermediate clock phase signal based on a first clock signal and a second intermediate clock phase signal and to generate a third intermediate clock phase signal in response to the clock signal and a fourth intermediate clock phase signal, the first latch including a second phase interpolation circuit having a first input coupled to a second input of the first latch and a second input coupled to a second output of the first latch; and a first phase interpolation circuit having a first input coupled to a first input of the first latch and a second input coupled to a first output of the first latch, wherein the first phase interpolation circuit is configured to output a first clock phase signal based on the first and second intermediate clock phase signals, and wherein the second phase interpolation circuit is configured to output a second clock phase signal in response to receiving the third and fourth intermediate clock phase signals.

2. The clock generator of claim 1, wherein the first phase interpolation circuit includes:
a first inverter having an input coupled to the first input of the first latch and an output coupled to a first node;
a second inverter having an input coupled to the first output of the first latch and an output coupled to the first node; and
a third inverter having an input coupled to the first node and an output for outputting the first clock phase signal.

3. The clock generator of claim 1, wherein the first latch includes:
a first inverter having an input coupled to the first input of the phase interpolation circuit;
a second inverter having an input coupled to the first input of the second phase interpolation circuit;
a first transistor having a gate configured to receive the first clock signal, a drain coupled to an output of the first inverter, and a source coupled to the second input of the first phase interpolation circuit; and
a second transistor having a gate configured to receive the first clock signal, a drain coupled to an output of the second inverter, and a source coupled to the second input of the second phase interpolation circuit.

4. The clock generator of claim 1, wherein the first phase interpolation circuit includes:
a first inverter having an input coupled to the first input of the first latch and an output coupled to a first node;
a second inverter having an input coupled to the first output of the first latch and an output coupled to the first node; and
a third inverter having an input coupled to the first node and an output for outputting the first clock phase signal.

5. The clock generator of claim 4, wherein the second phase interpolation circuit includes:
a fourth inverter having an input coupled to the second input of the first latch and an output coupled to a second node;
a fifth inverter having an input coupled to the second output of the first latch and an output coupled to the first node; and
a sixth inverter having an input coupled to the second node and an output for outputting the second clock phase signal.

6. The clock generator of claim 5, further comprising a second latch having a first output coupled to the first input of the first latch and a second output coupled to the second input of the first latch.

7. The clock generator of claim 4, further comprising a second latch having a first input coupled to the first output of the first latch and a second input coupled to the second output of the first latch.

8. The clock generator of claim 4, further comprising a second latch having a first output coupled to the first input of the first latch and a second output coupled to the second input of the first latch.

9. A method, comprising:
receiving a first clock signal and a first intermediate clock phase signal at a first latch;
generating a second intermediate clock phase signal based on the first clock signal and the first intermediate clock phase signal; and
interpolating the first and second intermediate clock phase signals to provide a first clock phase signal, wherein interpolating the first and second intermediate clock phase signals includes:
combining inversions of the first and second intermediate clock phase signals to produce a combined inverted signal; and
inverting the combined inverted signal to provide the first clock phase signal.

10. The method of claim 9, further comprising:
generating a third intermediate clock phase signal in response to the first clock signal and a fourth intermediate clock phase signal; and
interpolating the third and fourth intermediate clock phase signals to provide a second clock phase signal.

11. The method of claim 10, wherein the third intermediate clock phase signal is generated at the first latch.

12. The method of claim 9, wherein the inversions of the first and second intermediate clock phase signals are combined at a node coupled to outputs of first and second inverters.

13. The method of claim 9, further comprising:
generating a third intermediate clock phase signal based on a second clock signal and the second intermediate clock phase signal; and
interpolating the second and third intermediate clock phase signals to provide a second clock phase signal.

14. A multi-phase clock generator, comprising:
a first latch configured to
output a first intermediate clock phase signal based on a first clock signal and a second intermediate clock phase signal, and
output a third intermediate clock phase signal based on the first clock signal and a fourth intermediate clock phase signal;
a first phase interpolation circuit having a first input coupled to first input of the first latch and as second input coupled to a first output of the first latch, the first phase interpolation circuit configured to output a first clock signal based on the first and second intermediate clock phase signals; and
a second phase interpolation circuit having a first input coupled to a second input of the first latch and a second input coupled to a second output of the first latch, the second phase interpolation circuit configured to output a second clock phase signal based on the third and fourth intermediate clock phase signals.

15. The multi-phase clock generator of claim 14, wherein the first phase interpolation circuit includes:
a first inverter having an input coupled to the first input of the first latch and an output coupled to a first node;

a second inverter having an input coupled to the first output of the first latch and an output coupled to the first node; and a third inverter having an input coupled to the first node and an output for outputting the first clock phase signal.

16. The multi-phase clock generator of claim 14, wherein the second phase interpolation circuit includes:

a first inverter having an input coupled to the second input of the first latch and an output coupled to a first node;

a second inverter having an input coupled to the second output of the first latch and an output coupled to the first node; and a third inverter having an input coupled to the first node and an output for outputting the second clock phase signal.

17. The multi-phase clock generator of claim 14, wherein the first latch includes:

a first inverter having an input coupled to the first input of the phase interpolation circuit;

a second inverter having an input coupled to the first input of the second phase interpolation circuit;

a first transistor having a gate configured to receive the first clock signal, a drain coupled to an output of the first inverter, and a source coupled to the second input of the first phase interpolation circuit; and a second transistor having a gate configured to receive the first clock signal, a drain coupled to an output of the second inverter, and a source coupled to the second input of the second phase interpolation circuit.

18. The multi-phase clock generator of claim 14, further comprising a second latch having a first output coupled to the first input of the first latch and a second output coupled to the second input of the first latch, the second latch configured to output the second intermediate clock phase signal based on a second clock signal and a fifth intermediate clock phase signal, and output the fourth intermediate clock phase signal based on the second clock signal and a sixth intermediate clock phase signal.

19. The multi-phase clock generator of claim 14, further comprising a second latch having a first input coupled to the first output of the first latch and a second input coupled to the second output of the first latch, the second latch configured to output a fifth intermediate clock phase signal based on a second clock signal and the first intermediate clock phase signal, and output a sixth intermediate clock phase signal based on the second clock signal and the third intermediate clock phase signal.

20. A clock generator, comprising:

a first latch configured to output a first intermediate clock phase signal based on a first clock signal and a second intermediate clock phase signal; and a first phase interpolation circuit having a first input coupled to a first input of the first latch and a second input coupled to a first output of the first latch, the first phase interpolation circuit including a first inverter having an input coupled to the first input of the first latch and an output coupled to a first node, a second inverter having an input coupled to the first output of the first latch and an output coupled to the first node, and a third inverter having an input coupled to the first node and an output for outputting the first clock phase signal, wherein the first phase interpolation circuit is configured to output a first clock phase signal based on the first and second intermediate clock phase signals.

21. A method, comprising:

receiving a first clock signal and a first intermediate clock phase signal at a first latch;

generating a second intermediate clock phase signal based on the first clock signal and the first intermediate clock phase signal;

interpolating the first and second intermediate clock phase signals to provide a first clock phase signal;

generating a third intermediate clock phase signal in response to the first clock signal and a fourth intermediate clock phase signal; and interpolating the third and fourth intermediate clock phase signals to provide a second clock phase signal.

* * * * *